(12) United States Patent
Plat et al.

(10) Patent No.: US 6,262,435 B1
(45) Date of Patent: Jul. 17, 2001

(54) ETCH BIAS DISTRIBUTION ACROSS SEMICONDUCTOR WAFER

(76) Inventors: Marina V. Plat, 4620 Corrida Cir., San Jose, CA (US) 95129; Luigi Capodieci, 824 Mulberry La., Sunnyvale, CA (US) 94087; Scott A. Bell, 2313 Stokes St.; Todd Lukanc, 1245 Woodlawn Ave., both of San Jose, CA (US) 95128

( * ) Notice: Subject to any disclaimer, the term of this patent is extended or adjusted under 35 U.S.C. 154(b) by 0 days.

(21) Appl. No.: 09/203,616

(22) Filed: Dec. 1, 1998

(51) Int. Cl.[7] .................................................. H01L 23/58
(52) U.S. Cl. ................................................. 257/48; 438/14
(58) Field of Search ................................ 257/48; 438/14

(56) References Cited

U.S. PATENT DOCUMENTS

| | | |
|---|---|---|
| 5,032,890 * | 7/1991 | Ushiku et al. ........................ 257/211 |
| 5,372,914 | 12/1994 | Naito et al. . |
| 5,410,163 * | 4/1995 | Murakami ............................... 257/50 |
| 5,589,706 * | 12/1996 | Mitwalsky et al. .................. 257/529 |
| 5,789,300 | 8/1998 | Fulford, Jr. . |
| 5,795,815 | 8/1998 | Vokoun et al. . |
| 5,917,229 * | 6/1999 | Nathan et al. ........................ 257/529 |

\* cited by examiner

Primary Examiner—Sara Crane
(74) Attorney, Agent, or Firm—Renner, Otto, Boisselle & Sklar, LLP

(57) ABSTRACT

Test wafers used in the production of semiconductor wafers include a plurality of active structures which form operational circuitry of the test wafer. The active structures are densely populated in some areas of the test wafer and sparsely populated in other areas of the test wafer. It has been observed that critical dimensions such as etch bias and slope profiles of identical structures vary depending on whether the structure is formed in a densely or sparsely populated region. Dummy structures are formed on the test wafer so as to uniformly distribute the density of structures across the test wafer.

6 Claims, 9 Drawing Sheets

ETCH BIAS DISTRIBUTION ACROSS SEMICONDUCTOR WAFER

TECHNICAL FIELD

The present invention relates to the production of semiconductor wafers and test wafers used in developing the semiconductor wafer. In particular, the present invention relates to reducing variations in the etch bias and slope profile of structures formed at various locations across the test wafer.

BACKGROUND OF THE INVENTION

Integrated circuits are formed on semiconductor wafers typically made from silicon. The wafers are substantially round and typically have a diameter of approximately six to eight inches. Since a single integrated circuit die is often no more than 1 cm$^2$, a great many integrated circuit die can be formed on a single semiconductor wafer. After the semiconductor wafer has been processed to form a number of integrated circuit die on its surface, the wafer is cut along "scribe lines" to separate the integrated circuit die for subsequent packaging and use.

Formation of integrated circuits on the wafer is accomplished using photo-lithography. In general, lithography refers to processes for pattern transfer between various media. The basic photo-lithography system consists of a light source, a photomask (also known as "reticle") containing the pattern to be transferred to the wafer, a collection of lenses, and a means for aligning existing patterns on the wafer with patterns on the mask.

Exposing a resist on the wafer to light of an appropriate wavelength through the reticle causes modifications in the molecular structure of the resist polymers to allow for transfer of the pattern from the photomask to the resist. The modification to the molecular structure allows a resist developer to dissolve and remove the resist in the exposed areas, presuming a positive resist is used. If a negative resist is used, the developer removes the resist in the unexposed areas.

Once the resist on the wafer has been developed, one or more etching steps take place which ultimately allow for transferring the desired pattern to the wafer. For example, in order to etch a device feature layer disposed between the resist and substrate, an etchant is applied over the patterned resist. The etchant comes into contact with the underlying feature layer by passing through the openings in the resist formed during the resist exposure and development steps. Thus, the etchant serves to etch away those regions of the feature layer which correspond to the openings in the resist, thereby effectively transferring the pattern in the resist to the feature layer. In subsequent steps, the resist is removed and another etchant may be applied over the patterned feature layer to transfer the pattern to the wafer or another layer in a similar manner.

The resolution of an etching process is a measure of the accuracy of pattern transfer, which can be quantified by an etch bias quantity. Bias refers to the difference in lateral dimension between the etched image and the mask image. In the formula most commonly used at present, two parameters give the bias according to the equation $B=(d_m-d_f)$, where B stands for the etch bias, $d_m$ is the length of a particular critical dimension (CD) as measured along the mask image made in the resist before any etching of the device feature layer, and $d_f$ represents the final length of the CD measured along the bottom surface of the etched layer.

A zero-bias process produces a vertical edge profile coincident with the edge of the mask. In other words the etched device feature layer and the patterned resist would all be precisely aligned. In this case, there is no etching of the device feature layer or the resist in the lateral direction, and the pattern is perfectly transferred. This case represents the extreme of anisotropic etching. Achieving an anisotropic etch can be very important in the manufacture of some devices. However, as a practical matter, a perfectly anisotropic etch is difficult to achieve in many instances.

Referring now to FIGS. 1a–1c, the concept of etch bias is shown in more detail. FIG. 1a depicts a semiconductor device 20 under construction having a device feature layer 24 which has been formed upon semiconductor substrate 22. Previous to this step, a photoresist layer 28 has been formed over the device feature layer 24 and patterned by well-known photolithographic means, and the photoresist 28 has a dimension of $d_m$ which is measured from above.

At this stage, the physical or chemical etch of the device feature layer 24 is ready to occur. This etching gives a structure such as that seen in FIG. 1b, viewed from above, where the device feature layer 24 has been formed having the dimension $d_f$, which is reduced from the dm dimension. From FIG. 1b, the etch bias may be taken as $B=(d_m-d_f)$. The dimension of $d_m$, shown in FIG. 1b is presented for comparison purposes only.

FIG. 1c illustrates in profile the result of etching the feature layer 24 depicted in FIG. 1b in which a measurable etch bias exists. As can be seen, following etching, the feature layer 24 includes sloped edges 26 due to the imperfect anisotropic etch. The sloped edges 26 define a slope profile or slope effect of the feature layer 24 which is proportional to the etch bias.

While eliminating etch bias and minimizing the slope effect is of concern, the ability to anticipate the effect that the etch bias and slope profile will have on a final integrated circuit is also of significant importance. For example, during development of wafers, often times test die and test circuits are produced so that discrete functions may be tested prior to development of a final wafer. For example, for a single die on a final wafer there may be on the order of twenty test die produced on test wafers prior to integrating the desired circuit onto the final wafer. During production and testing of these test die, it is advantageous to measure the etch bias and slope profile on the structures created so that appropriate calculations can be made as to how these may effect the final wafer. Hereinafter, "structures" shall refer to any line or other formation etched into or onto a test wafer or final wafer. By having advanced knowledge regarding the expected critical dimensions of a given structure, the ability to integrate such a structure into a wafer without interfering with adjacent lines can be better accessed. As etch bias, slope effect, and other critical dimension measurements made during the testing phase play a significant factor in determining the overall integration of the final wafer structure, accurate and representative measurements are highly desirable.

SUMMARY OF THE INVENTION

It has been observed that the critical dimensions of structures produced on a test wafer vary depending on whether the structure in located in a densely populated area of the wafer or a sparsely populated area of the wafer. For instance, as a result of etching, structures located in densely populated regions of a wafer were found to have a smaller etch bias than those structures located in sparsely populated areas. Because final wafers ultimately formed from the test wafers are highly integrated and have a dense population of circuits, such wafers typically do not include sparsely populated regions as in the test wafers. Accordingly, conventional critical dimension measurements of those structures located in sparsely populated regions of a test wafer do not always provide accurate and representative data regarding what the critical dimensions of such structures will be when integrated into a densely populated region.

The present invention relates to a method and apparatus for controlling the critical dimensions of those structures produced on sparsely populated areas of a test wafer so they more accurately depict the actual critical dimensions found for such structures on a densely populated final wafer. In order to do so, the present invention provides for adding dummy structures on a test reticle in those areas having sparsely populated test circuits. In this manner, the test wafer will be formed having uniformly densely populated regions similar to the conditions under which the final wafer is produced. The dummy structures are added so as to not interfere with the active structures which form the test circuits.

By adding an appropriate amount of dummy structures, the pattern transferred to the test wafer is substantially uniformly patterned with a dense population of structures which is approximately representative of the density of the final wafer to be ultimately produced. In this manner, critical dimension measurements such as etch bias and slope profile of active structures formed at any region of the test wafer will more closely approximate the critical dimension measurements of corresponding active structures formed on the final wafer. Also, as a result of forming a substantially even distribution of structures on the test wafer, the etch bias and slope profile differences between conventional densely and sparsely populated areas is substantially minimized. As such, more predictable and uniformly applicable measurements can be obtained from any region of the test wafer.

Thus, according to one aspect of the present invention, a method for designing a test wafer is provided. The method includes the steps of determining a feature of an integrated circuit to be tested, forming a test reticle, the test reticle including active patterns for forming the feature on the test wafer, adding dummy patterns on the test reticle in a manner predetermined to emulate a density of patterns in a region of a reticle used to produce the feature on the integrated circuit, and forming the test wafer using the test reticle.

In accordance with another aspect of the present invention, a method for controlling critical dimension variations among active structures disposed at various locations on a semiconductor wafer is provided. The active structures form components of operational circuitry associated with the semiconductor wafer. The method includes the step of forming on the semiconductor wafer the active structures and a dummy structure.

In accordance with another aspect of the present invention, a semiconductor wafer is provided. The semiconductor wafer includes a substrate, a plurality of active structures formed on the substrate, the active structures forming components of operational circuitry associated with the semiconductor wafer, and a dummy structure formed on the substrate.

In accordance with yet another aspect of the present invention, a reticle for use as a mask in forming a pattern on a semiconductor wafer is provided. The reticle includes an optical transmissive plate, and a patterned film disposed on the plate, the patterned film having active pattern portions and dummy pattern portions, the active pattern portions corresponding to portions of the patterned film which form active structures on the semiconductor wafer, the active structures being used as part of operational circuitry associated with the semiconductor wafer.

To the accomplishment of the foregoing and related ends, the invention then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed and the present invention is intended to include all such embodiments and their equivalents. Other objects, advantages and novel features of the invention will become apparent from the following detailed description of the invention when considered in conjunction with the drawings.

DETAILED DESCRIPTION OF THE INVENTION

The present invention will now be described with respect to the accompanying drawings in which like numbered elements represent like parts.

Figure 1A:
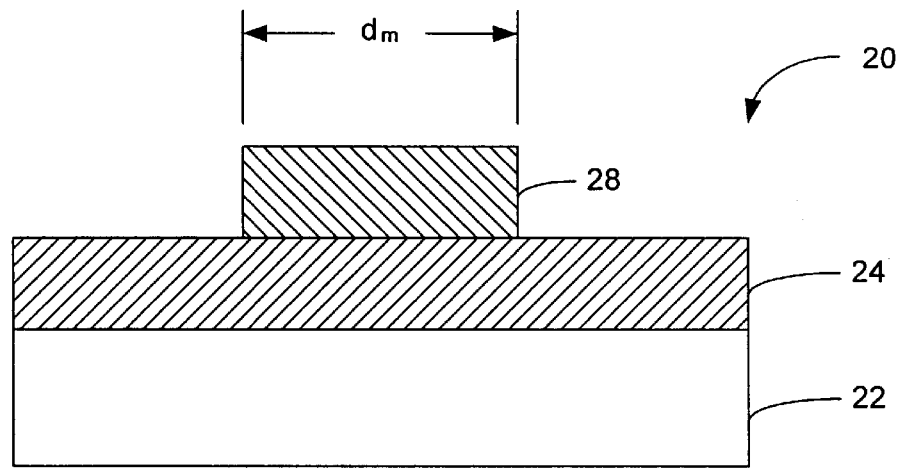
FIG. 1a is a cross sectional view of a semiconductor device depicting a resist layer dimension used in calculating critical dimensions.
Figure 1B:
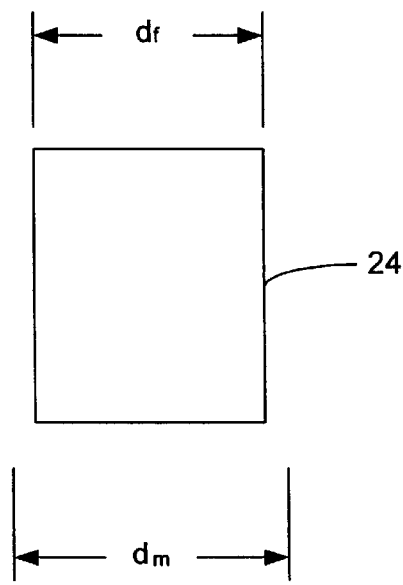
FIG. 1b is a top view of the semiconductor device of FIG. 1a after having the resist layer removed.
Figure 1C:
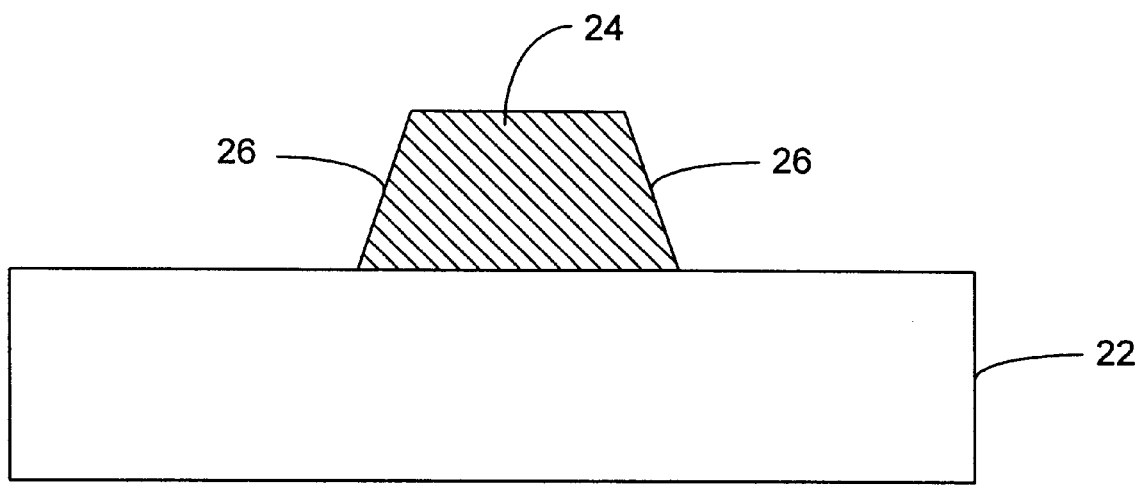
FIG. 1c is a cross sectional view of the semiconductor device of FIG. 1a depicting the slope profile of a patterned feature layer following etching.
Figure 2:
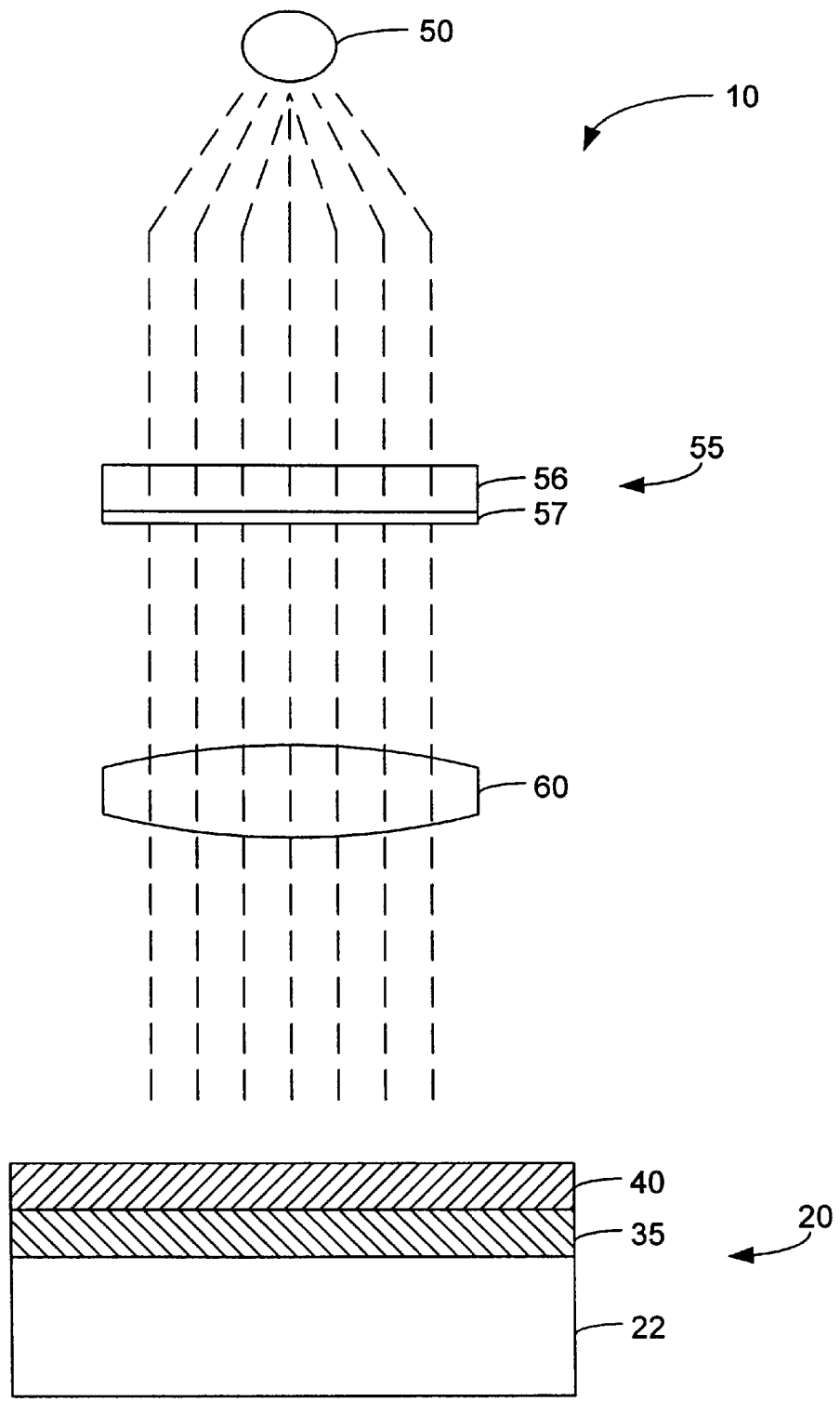
FIG. 2 is an overview of a photo-lithography process in accordance with the present invention.
Figure 3:
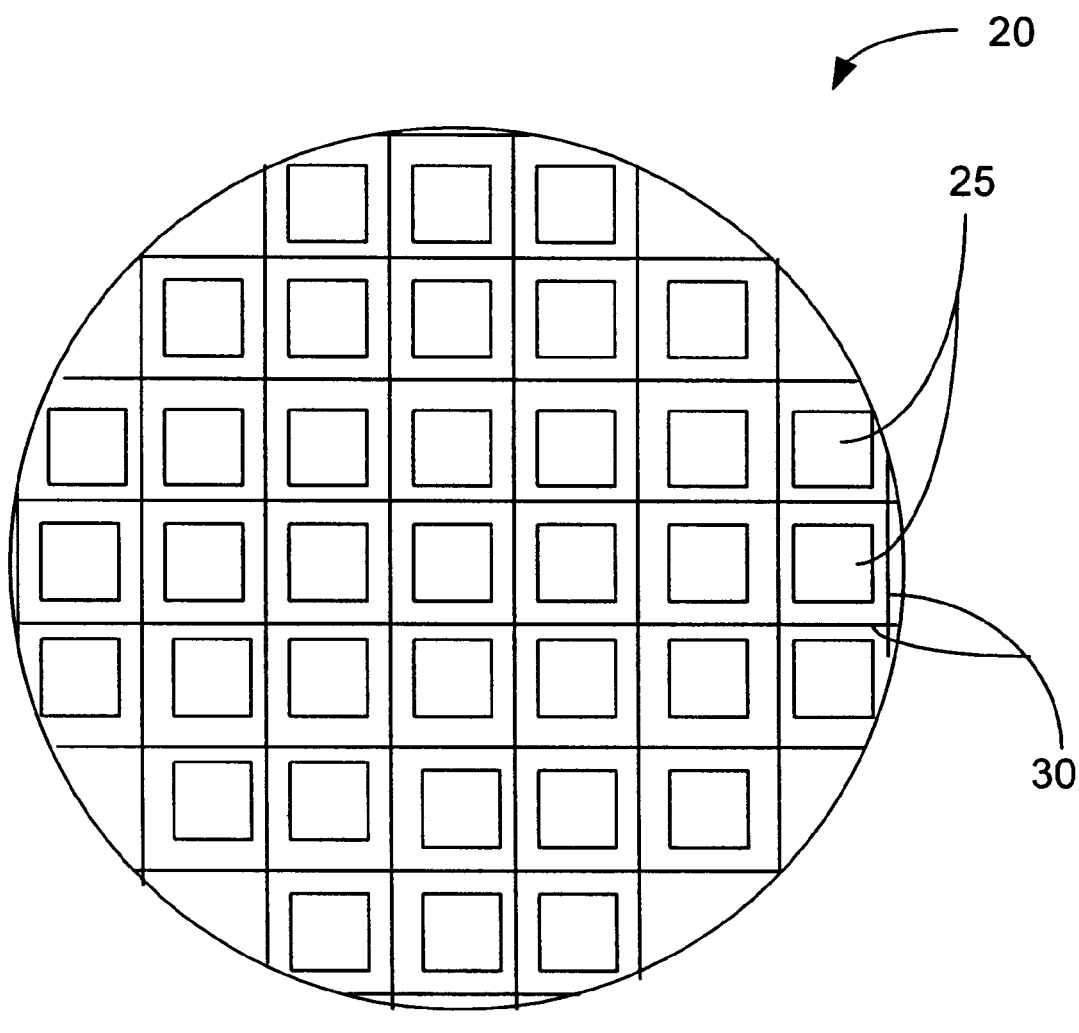
FIG. 3 is an enlarged view of a portion of a test wafer having a plurality of test die formed therein in accordance with the present invention.

Referring initially to FIG. 2, a photo-lithographic system 10 for printing a test wafer 20 is depicted. The test wafer 20 is used to produce and test circuits which will ultimately be formed on a final wafer. As best seen in FIG. 3, in the present embodiment, the test wafer 20 is divided up into a number of test die 25 which are separated by scribe lines 30. As is conventional, the scribe lines 30 may be either positive mesa type lines or negative lines and allows for separating the individual test die 25 from one another after completing production of the test wafer 20. In the present embodiment, each test die is produced to have an identical circuit, however, it will be appreciated that test die having various circuit configurations could alternatively be produced.

Referring back to FIG. 2, at this stage in the development cycle the test wafer 20 is shown to include a semiconductor substrate 22 having a feature layer 35 formed thereon and a photo-resist 40 (hereinafter "resist 40") formed over the feature layer 35. The feature layer 25 may, for example, be a film layer or a layer of polysilicon. The resist 40 is the present embodiment is a positive resist, however negative resist could alternatively be used.

In order to pattern the resist 40, the system 10 includes an illumination source 50 that provides an appropriate amount of optical energy for transforming the resist 40. A test reticle 55 is provided between the light source and the wafer 20 to serve as a test mask in transferring a desired pattern through an optical subsystem 60 to the resist 40 as described in more detail below. The test reticle 55 includes a glass or quartz plate 56 with a chrome layer 57 patterned thereon. The pattern formed on the test reticle 55 is provided using conventional techniques known in the art. For example, the test reticle 55 may be patterned by forming a layer of photo-resist over the chrome layer 57 and patterning the photo-resist using electron beam. The chrome layer 57 is then etched and the photo-resist removed thereby leaving behind the desired pattern. It will be appreciated that other known reflective or transmissive type reticles and corresponding pattern transfer systems could be used. Further, it will be appreciated that while the system 10 utilizes projection type printing, other printing techniques such as contact printing or proximity could alternatively be used.

The inventors of the present invention have observed that the critical dimensions (CD) of active structures produced on a test wafer vary depending on whether the active structure in located in a densely populated area of the wafer or a sparsely populated area of the wafer. Hereinafter "active structures" shall mean structures which form a part of the active or operational circuits produced on a wafer. For example, active structures may be a line that forms part of an SRAM or transistor circuit on the wafer. It has been found that CD's related to etch bias and the slope profile of a line vary depending on whether the surrounding region is densely or sparsely populated. In particular, it has been found that structures formed in sparsely populated regions have greater slope profiles and greater negative etch bias than structures formed in densely populated regions.

Figure 4:
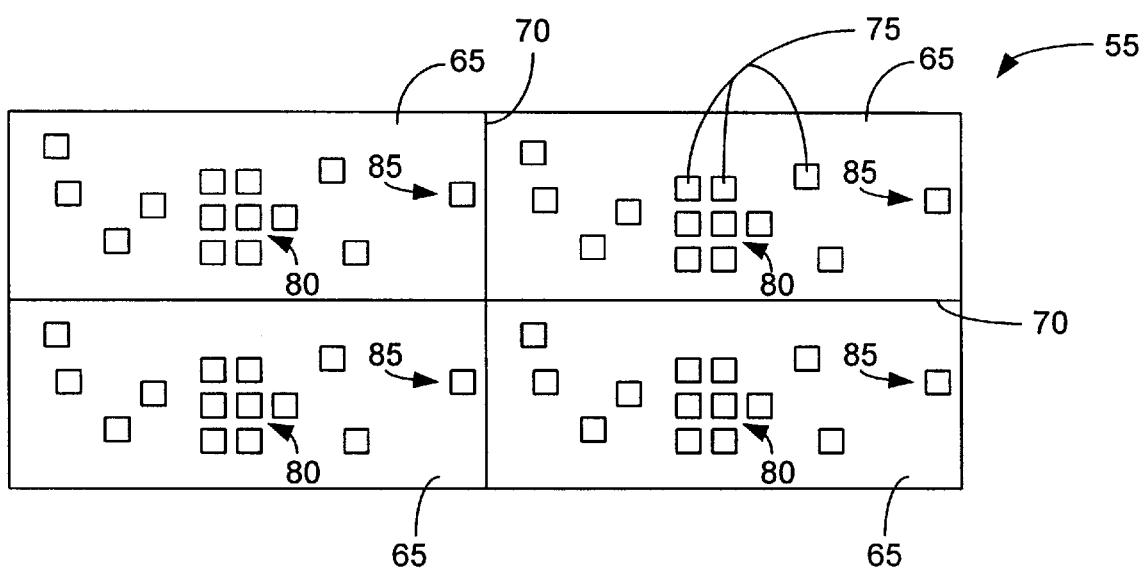
FIG. 4 is a top view of a test reticle in a conventional system having densely and sparsely populated regions.

For instance, referring to FIG. 4 there is shown a conventional test reticle 55 in which the test reticle 55 is divided up into four identical regions 65 for patterning four corresponding test die 25 (FIG. 3) on the test wafer 20. Dividing lines 70 between each of the four regions 65 correspond to the scribe lines 30 (FIG. 3) formed on the wafer 20. The density of test pattens at any region along the test reticle 55 is representatively depicted by the frequency of occurrence of the square blocks 75. Accordingly, as seen in FIG. 4, conventional test reticles 55 include both densely populated regions 80 such as that near the center of each region 65, and sparsely populated regions 85 such as that near the edges of the test reticle 55 and near the dividing lines 70. For example, the densely populated regions 80 may include patterns for forming MRAM or SRAM on the test wafer 20 while the sparsely populated regions 85 may include a small circuit incorporated into a test tile. While the present embodiment depicts the test reticle 55 to include four regions 65, it will be appreciated that the test reticle 55 may include any number of regions.

Figure 5:
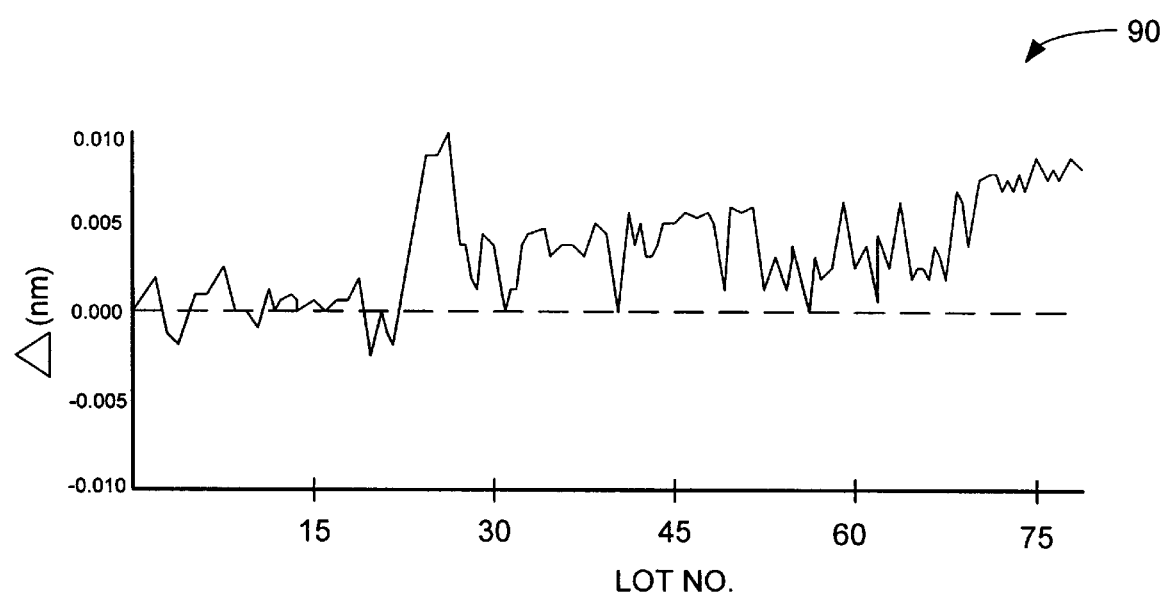
FIG. 5 is a graph illustrating how etch bias varies between structures formed in densely populated areas verus sparsely populated areas.

Referring now to FIG. 5 a graph 90 shows the change in line width between a line formed in the densely populated die area and a line formed in a sparsely populated scribe area for various lots of wafers produced over a course of time. For example the various lots of wafers may be produced over the course of one to three days. In particular, the y-axis shown in FIG. 5 corresponds to the change in line widths, in nano-meters, between the structures formed in the densely and sparsely populated regions, and the x-axis corresponds to a given lot number. As can be seen from the graph 90, during the course of producing various lots, the measured change between the densely and sparsely populated regions can vary significantly from one lot to the next. It was determined that such variations could be minimized by populating each region of the wafer with a uniform density of structures.

Unlike the individual test die 25 produced during the testing phase, the actual die of a final semiconductor wafer is typically densely populated with active structures across the entire die. In conventional systems, the etch bias and slope profiles determined with respect to structures included in sparsely populated regions of the test wafer 20 was not fully representative of the actual etch bias likely to occur on the densely populated die on a completed wafer. Accordingly, the present invention provides for adding dummy structures in those areas of the test die 25 which would otherwise be sparsely populated. In particular, the present invention provides for adding an adequate number of dummy structures so as to approximate the actual density of structures included at each region of a final die.

Figure 6:
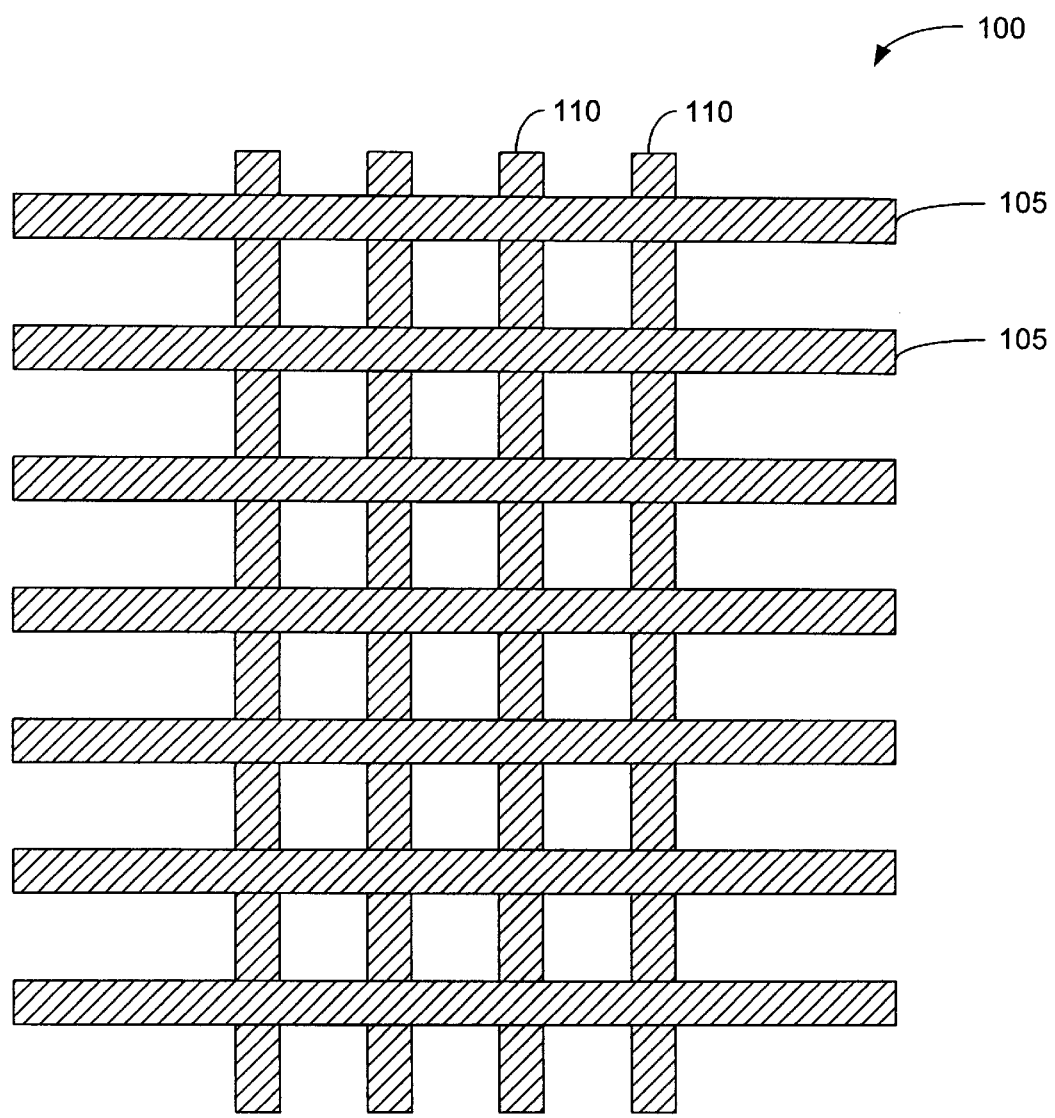
FIG. 6 is a top view of one type of dummy structure which may be added to the test reticle in order to uniformly populate the test reticle in accordance with the present invention.

Referring now to FIG. 6, there is depicted a dummy structure 100 of the type which could be used in conjunction with the present invention. As will be described in more detail below, a pattern corresponding to the dummy structure 100 is initially formed in the test reticle 55 and transferred to the wafer 20 using photo-lithography. The dummy structure 100 of the present embodiment includes a cross pattern of horizontal and vertical lines 105, 110, respectively. In the present embodiment, each line 105, 110 is approximately one to two microns in width and 10 to 20 microns in length. Further, each of the dummy structure lines 105, 110 is situated so they do not contact any active structure and preferably are at least 10 microns away from any active structure on the test wafer 20. In this manner the dummy structure 110 does not interfere with the active structures used in to form the circuits in the test wafer.

While the present embodiment provides a dummy structure of a particular pattern and dimension for exemplary purposes, it will be appreciated that any size and any pattern of dummy structures could alternatively be used. For instance, a dummy structure could include one or more lines which is/are oriented horizontally, vertically, bent, or otherwise. In general, the dummy structures will be sized and patterned to adequately populate sparsely populated regions of a test die to more closely emulate the density of a final die of a final wafer.

Figure 7:
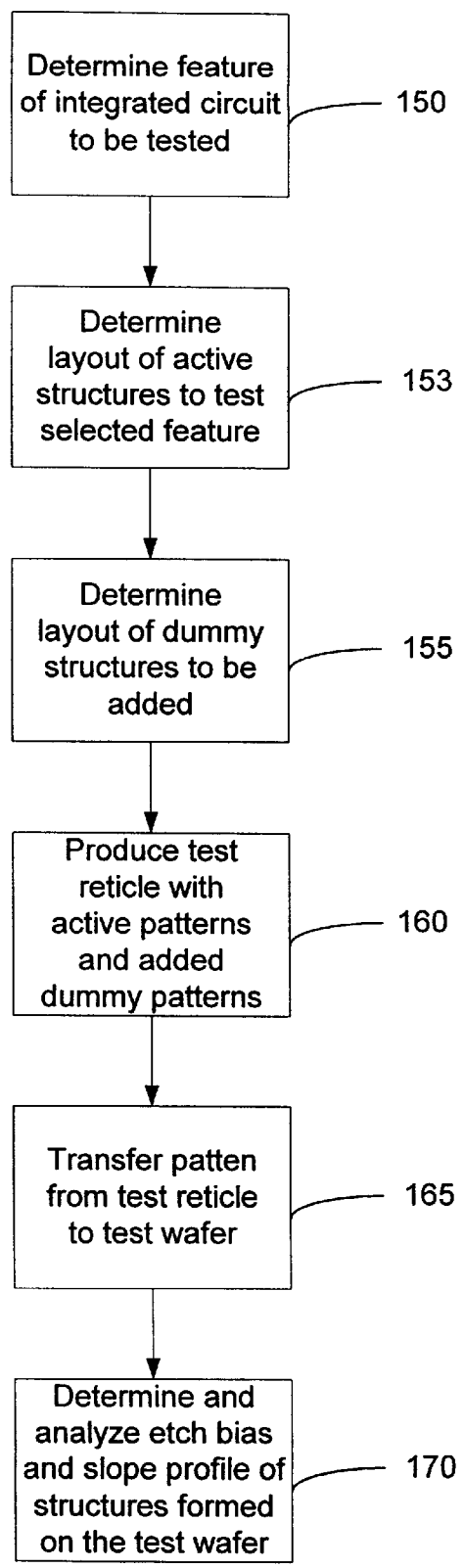
FIG. 7 is a flowchart describing the steps of forming and analyzing a test wafer in accordance with the present invention.

Referring now to FIG. 7, a flow chart showing the steps taken to produce and evaluate a test wafer 20 in accordance with the present invention is shown. In step 150, a determination is made as to a feature of an integrated circuit which is to be tested. For example, the feature may be a series of transistors which are to perform a specific function on a final wafer. Next, in step 153, a layout of the active structures needed to reproduce and test the selected feature is determined. Based on the layout showing the density of active structures on each test die, a determination is made as to the layout of additional dummy structures to be formed on the test die. As discussed above, the dummy structures are added to the layout in a manner predetermined to emulate the density of structures formed in a region of the selected feature on the final wafer. For example, if the region surrounding the selected feature on the final wafer is densely populated, then the dummy structures are added to form a correspondingly densely populated region around the feature being tested.

Figure 8:
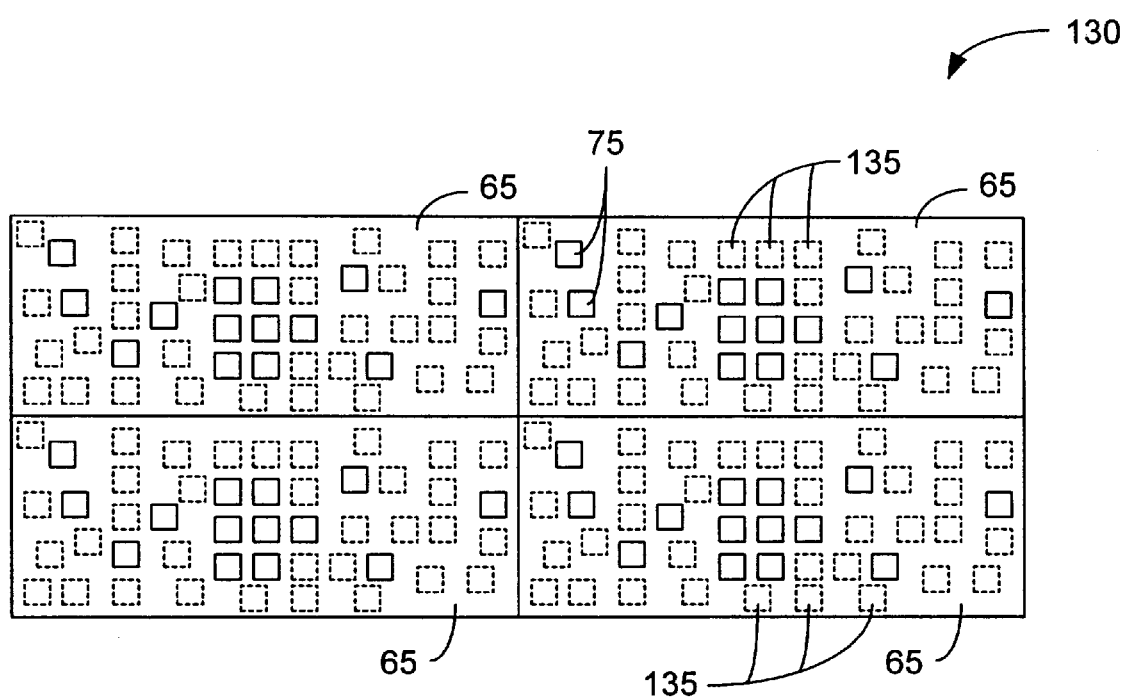
FIG. 8 is a top view of a test reticle after having added dummy structures in accordance with the present invention.

Once the layout of both the active and dummy structures is determined, a test reticle 130 is produced in step 160. In order to form the test reticle 130, the active and dummy patterns which respectively correspond to the active structures and dummy structures to be produced on the test wafer are patterned onto the test reticle 130. For example, referring to FIG. 8, in the present embodiment the regions of the test reticle 130 having the dummy structures formed thereon is representatively depicted by the dashed square blocks 135. The regions of the test reticle 130 having active patterns formed thereon are depicted by solid squares 75. Thus, as can be seen, the overall density of patterns formed in each region 65 of the test reticle 130 is substantially uniform so as to emulate in a predetermine manner the density of patterns formed in a region of a reticle us ed to produce the selected feature on the integrated circuit. For example, if a reticle used to produce the selected feature included a densely populated pattern around the selected feature, then dummy patterns would be correspondingly added to the test reticle 130 to produce a similar density of patterns.

Next, in step 165, the pattern formed on the test reticle is transferred to the test wafer 20. Formation of both the active structures and dummy structures 100 on the test wafer 20 is accomplished using conventional photo-lithographic pattern transfer techniques. In particular, the pattern formed in the test reticle 130, which now includes dummy patterns for forming dummy structures 100 and active patterns for forming active structures, is transferred to the resist 40 during exposure of the resist 40 to radiation from the illumination source 50. Once transferred to the resist 40, the underlying feature layer 35 is etched using conventional etching techniques.

In step 170, the etch bias and slope profile of each active structure formed on the test wafer 20 is determined and analyzed using conventional techniques known in the art. Because the dummy structures have been added to provide uniformity in density across regions of densely populated active structures and sparsely populated active structures, etch bias and slope profile differences among structures formed on the test wafer is substantially reduced. Also, since the density of the overall structures formed on the test wafer 20 emulates the density of a final wafer, the critical dimension measurements obtained from the etched layers associated with the test wafer 20 are representative of the actual critical dimension measurements which would result from formation of a corresponding circuit on the final wafer.

The invention has been described with reference to the preferred embodiments. Obviously, modifications and alterations will occur to others upon reading and understanding the preceding detailed description. For example, while the preferred embodiments described adding a sufficient number of dummy structures to uniformly and densely populate a test wafer, it will be appreciated that such uniformity and density is not required. In particular, if a final production wafer included both densely and sparsely populated regions, then only a sufficient number of dummy structures which correspondingly provided densely and sparsely populated regions of a test wafer may be used. Additionally, while the embodiments disclosed herein refer to developing a test wafer, it will be appreciated that such dummy structures could also be added to production of a final wafer in order to obtain uniform critical dimension control. It is intended that the invention be construed as including all such modifications alterations, and equivalents thereof and is limited only by the scope of the following claims.

What is claimed is:

1. A semiconductor test wafer comprising:
   a substrate having at least one first region and at least one second region;
   a plurality of active structures formed on the substrate, the active structures forming components of operational circuitry associated with the semiconductor wafer, the at least one first region being more densely populated with the plurality of active structures than the at least one second region; and
   a plurality of dummy structures formed on the substrate in the at least one second region to provide a more uniform density of structures in the at least one second region relative to the at least one first region, wherein the number of the plurality of dummy structures in combination with the plurality of active structures approximates the actual density of active structures found in a production wafer.

2. The semiconductor wafer of claim 1, wherein at least some of the plurality of dummy structures are formed by a cross pattern.

3. The semiconductor wafer of claim 1, wherein the at least one second region is located near scribe lines formed on the semiconductor wafer.

4. The semiconductor test wafer of claim 1, wherein each plurality of dummy structures is at least 10 microns away from any of the active structures.

5. The semiconductor test wafer of claim 1, wherein each of the dummy structures is approximately 20 microns or less in length.

6. The semiconductor test wafer of claim 1, wherein each of the dummy structures is 2 microns or less in width.

* * * * *